(12) United States Patent
Schamberger et al.

(10) Patent No.: US 7,427,202 B2
(45) Date of Patent: Sep. 23, 2008

(54) MEANS OF MOUNTING FOR ELECTRONIC COMPONENTS, ARRANGEMENT AND PROCEDURE

(75) Inventors: Florian Schamberger, Bad Reichenhall (DE); Michael Bernhard Sommer, Raubling (DE); Andreas Baenisch, Munich (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/317,638

(22) Filed: Dec. 22, 2005

(65) Prior Publication Data

US 2006/0170115 A1    Aug. 3, 2006

(30) Foreign Application Priority Data

Dec. 27, 2004    (DE) ................. 10 2004 062 885

(51) Int. Cl.
*H01R 12/00* (2006.01)

(52) U.S. Cl. .......................... 439/66; 439/128
(58) Field of Classification Search ................ 439/66, 439/55, 65, 68, 91, 128, 71; 257/787; 438/128
See application file for complete search history.

(56) References Cited

U.S. PATENT DOCUMENTS

| | | | |
|---|---|---|---|
| 3,526,867 A | 9/1970 | Keeler | |
| 3,981,051 A | 9/1976 | Brumlik | |
| 5,312,456 A | 5/1994 | Reed et al. | |
| 6,215,670 B1 * | 4/2001 | Khandros | 361/774 |
| 6,224,396 B1 * | 5/2001 | Chan et al. | 439/71 |
| 6,250,933 B1 * | 6/2001 | Khoury et al. | 439/66 |
| 6,287,126 B1 | 9/2001 | Berger et al. | |
| 6,555,415 B2 | 4/2003 | Hedler | |
| 6,632,400 B1 | 10/2003 | Brennen et al. | |
| 6,672,876 B1 * | 1/2004 | Takekoshi | 439/66 |
| 6,690,185 B1 * | 2/2004 | Khandros et al. | 324/758 |
| 6,756,540 B2 * | 6/2004 | Hedler et al. | 174/539 |
| 6,913,468 B2 * | 7/2005 | Dozier et al. | 439/66 |
| 7,066,740 B2 * | 6/2006 | Audet et al. | 439/66 |
| 7,094,117 B2 * | 8/2006 | Farnworth et al. | 439/886 |
| 7,099,525 B2 * | 8/2006 | Bakir et al. | 385/14 |

FOREIGN PATENT DOCUMENTS

| | | |
|---|---|---|
| DE | 2112238 | 10/1971 |
| DE | 692 26 384 T2 | 12/1998 |
| DE | 199 27 749 A1 | 12/2000 |
| DE | 101 22 133 A1 | 1/2002 |

* cited by examiner

*Primary Examiner*—Michael C Zarroli
(74) *Attorney, Agent, or Firm*—Slater & Matsil, L.L.P.

(57) ABSTRACT

A means of attachment for electrically contacting electronic components is disclosed. The means of attachment includes a carrier element and a number of elongated connecting elements. Each of the connecting elements is arranged on the carrier element and has an elongated body, which protrudes from the carrier element. Each of the connecting elements and the carrier element includes an electrically conductive surface.

60 Claims, 12 Drawing Sheets

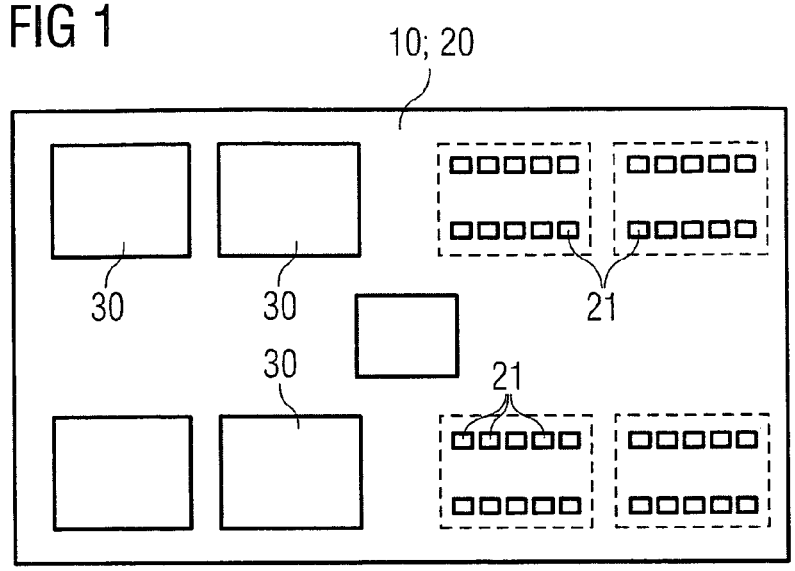
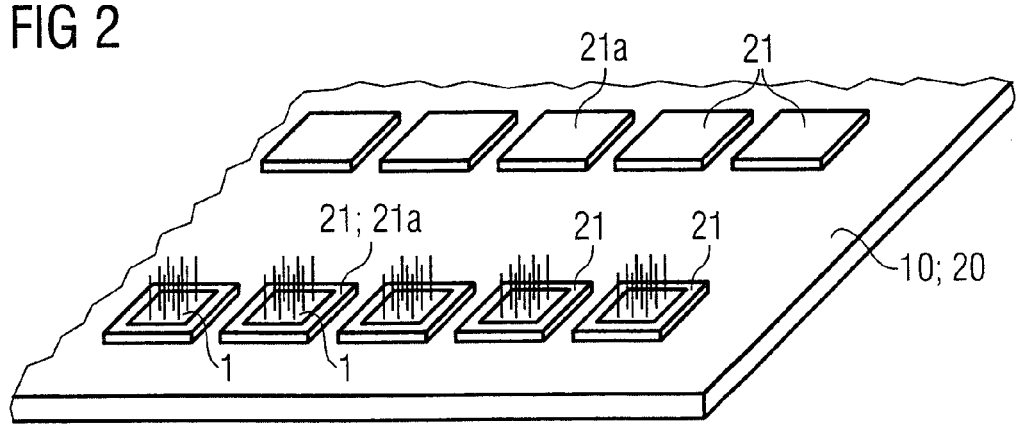

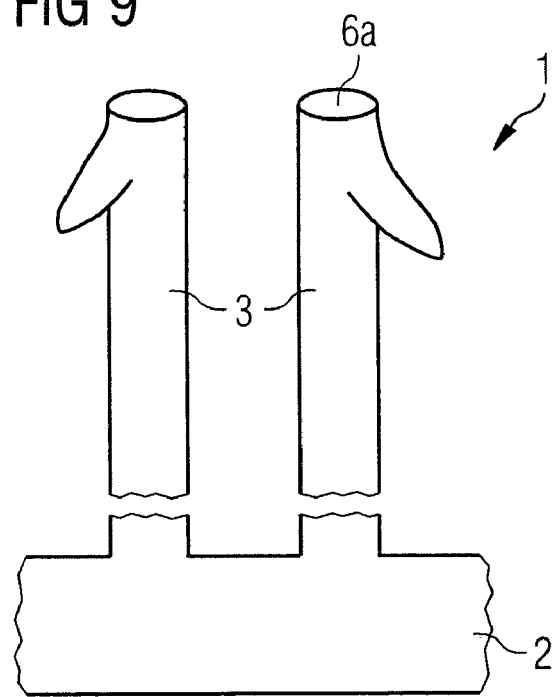
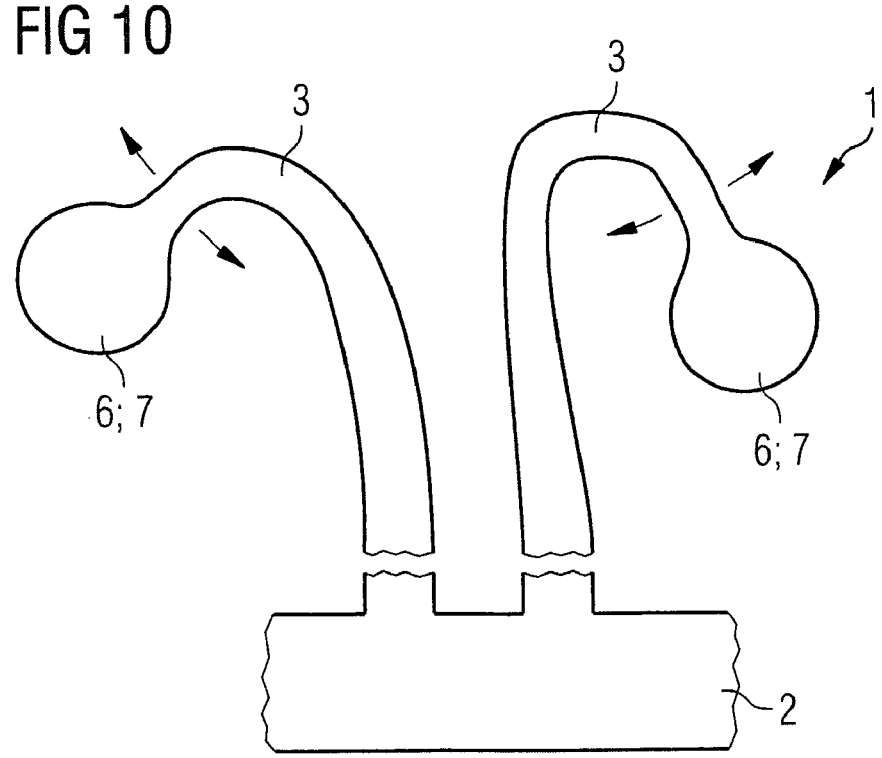

FIG 17

```
┌─────────────────────────────────────────────────┐
│ PROVIDING A SEMICONDUCTOR DEVICE 30, AN ELECTRONIC │
│ CIRCUIT BOARD 20 AND ATTACHING ELEMENTS 1. EACH OF │
│ THE ATTACHING ELEMENTS 1 INCLUDES A CARRIER        │
│ ELEMENT 2 AND CONNECTING ELEMENTS 3                │
└─────────────────────────────────────────────────┘
                         │
                         ▼
┌─────────────────────────────────────────────────┐
│ PLACING ATTACHING ELEMENTS 1 ON                 │
│ CANTACT TERMINALS 21 AND 31 OF                  │
│ SEMICONDUCTOR DEVICE 30 AND PRINTED             │
│ CIRCUIT BOARD 20                                │
└─────────────────────────────────────────────────┘
                         │
                         ▼
┌─────────────────────────────────────────────────┐
│ APPLYING ADHESIVE 15 TO ONE OR BOTH OF          │
│ SEMICONDUCTOR DEVICE 30 AND PRINTED             │
│ CIRCUIT BOARD 20                                │
└─────────────────────────────────────────────────┘
                         │
                         ▼
┌─────────────────────────────────────────────────┐
│ ARRANGING SEMICONDUCTOR DEVICE 30 AND PRINTED   │
│ CIRCUIT BOARD 20 SUCH THAT THE CONNECTING ELEMENTS│
│ 3A AND 3B OF ATTACHING ELEMENTS 1 FACE EACH OTHER.│
│ PRESSING SEMICONDUCTOR DEVICE 30 AND PRINTED    │
│ CIRCUIT BOARD 20 TOGETHER SO THAT CONNECTING    │
│ ELEMENTS 3A AND 3B ENGAGE ONE ANOTHER.          │
└─────────────────────────────────────────────────┘
```

MEANS OF MOUNTING FOR ELECTRONIC COMPONENTS, ARRANGEMENT AND PROCEDURE

This application claims priority to German Patent Application 10 2004 062 885.8, which was filed Dec. 27, 2004, and is incorporated herein by reference.

TECHNICAL FIELD

The invention relates to a means of attachment for electrically contacting electronic components. The invention also relates to an electronic component, to an arrangement with an electronic printed circuit board and at least one semiconductor device and also to a method for attaching a semiconductor device on an electronic printed circuit board. Finally, the invention relates to a method for forming a means of attachment in each case on a plurality of contact terminals of an electronic component.

BACKGROUND

Semiconductor devices, in particular memory devices with an integrated memory chip, but also unpackaged semiconductor chips, are conventionally attached on electronic printed circuit boards (PCBs), by being soldered onto the electronic printed circuit boards. Printed circuit boards with a number of memory devices are used for example as memory modules. The semiconductor chips of the semiconductor devices are connected to the chip package for instance by bonding wires. The chip package has contact terminals, which are soldered onto corresponding contact terminals of the electronic printed circuit board.

Integrated semiconductor circuits contain a plurality of dopant regions, which are thermally created by diffusion processes. After completion of the integrated semiconductor circuit, during the further processing of the chip and during later operation, the dopant profiles of the dopant regions are intended to remain unchanged. If the contact terminals of a memory device are soldered onto the printed circuit board, the heated solder contacts lead to the memory chip itself being heated up again. As a result, the dopant profiles can change again; for example, buried straps which establish the electrical connection between selection transistors and trench capacitors of a memory cell array can become high-impedance. Small changes of the dopant profiles also allow leakage mechanisms of integrated memory cells to come into being, with the effect of reducing the storage time (retention behavior). Dopant profiles of other doped regions may also be distorted by the temperature increase brought about by the soldering-on process. The thermal budget that must not be exceeded to maintain the spatial form of the dopant profiles may be exceeded, at least locally, as a result of the soldering process. Even if only a limited amount of heat is supplied during the soldering, a residual risk of undesired dopant diffusion in the semiconductor chip nevertheless remains.

Furthermore, the use of solder pastes leads to disposal problems if they contain lead. Leadfree solder pastes, on the other hand, are nowadays only suitable to a limited extent for wetting the contact terminals to be contacted of chip packages and electronic printed circuit boards.

SUMMARY

It is the object of the present invention to present new ways of electrically/mechanically connecting semiconductor devices in which there is a much reduced risk of unintentional dopant diffusion in the semiconductor devices. It is also the object of the present invention to provide means of attachment which can be used for connecting semiconductor devices and lead to reduced thermal loading of the semiconductor devices during placement on the PBS. It is also the object of the invention to provide a new technique for electrically connecting packaged or unpackaged semiconductor chips and electronic printed circuit boards to one another.

This object is achieved by a means of attachment for electrically contacting electronic components, the means of attachment having a carrier element and a plurality of elongate connecting elements, the connecting elements being arranged on the carrier element and having in each case an elongate body, which protrudes from the carrier element, all the connecting elements and the carrier element being electrically conductive, at least on their surface.

The invention proposes a means of attachment including a carrier element, on which is a dense arrangement of many microscopically small, elongated connecting elements protruding from the carrier element and arranged next to one another on one side of the carrier element. The connecting elements have, for example, a form which is suitable for engaging and/or hooking with another identical or complementary means of attachment. The means of attachment according to the invention then works in a way similar to a Velcro® fastener, but is provided with much smaller connecting. The connecting elements present in large numbers on a carrier element, which corresponds in size to the size of an electrical contact of the semiconductor device. The connecting elements may, however, similarly serve the purpose of merely pressing against an electrical contact terminal of a further electronic component, to establish an electrical connection between the contact terminals of two electronic components. In both cases, electronic or microelectronic components provided with the means of attachment according to the invention can be electrically connected to one another by simply pressing them together.

According to the invention, these microscopically small connecting elements are electrically conducting, at least on their surface, and therefore serve not only for the mechanical attachment, but also for electrically contacting a semiconductor device, for example to a printed circuit board or another semiconductor device. Furthermore, the carrier element of the means of attachment is electrically conductive and can therefore be applied to a contact terminal of a semiconductor device, for example by bonding.

The means of attachment according to the invention is first placed with its carrier element on the electronic or microelectronic components to be connected to one another, for instance on a semiconductor device and on an electronic printed circuit board. In this case, a means of attachment according to the invention is used for placement on each contact terminal of the semiconductor device and the printed circuit board that is to be contacted. After that, each contact terminal is provided with in each case a plurality of microscopically small connecting elements in wire form, which establish a Velcro® like mechanical connection with the other devices when the latter, likewise provided with corresponding means of attachment, are pressed against the semiconductor device or the printed circuit board. The placement of the means of attachment according to the invention on the contact terminals of an electronic component before the actual joining together of the components has the advantage that no soldering processes are required during the subsequent joining together. As a result, the thermal loading of the integrated semiconductor circuits is much reduced.

It is preferably provided that the means of attachment is formed in one piece by the carrier element and the plurality of connecting elements. In particular, it is preferably provided that the carrier element and the connecting elements are formed by a common basic body. For instance, the carrier element and the connecting elements may have a common basic body, which if appropriate may also be coated. It is preferably provided that the carrier element is formed from the same material as the connecting elements. Furthermore, it is preferably provided that the carrier element and the connecting elements are formed from a metal or metal alloy. Apart from the electrical connecting of contact terminals of two components, the means of attachment also preferably serves the purpose of attaching two electronic components mechanically to one another. However, the means of attachment may also generally be merely a connecting means which only establishes an electrical connection but does not serve for attaching two components or their contact terminals to one another. All that is needed for electrical connection is just to touch one contact terminal of a further component. However, for the sake of simplicity, in this application reference is always made to a means of attachment; a restriction to connecting elements which also serve at the same time for mechanical attachment is not intended.

The connecting elements of the means of attachment (or the connecting means) may have a form suitable for engaging or hooking in between connecting elements of a further means of attachment. The connecting elements may, for example, have male or female end pieces, which are suitable for engaging in corresponding female or male counterpieces of a further means of attachment.

The connecting elements may be formed as ultrafine wires. Their diameter may be, in particular, between 0.1 and 10 μm.

Preferably, the means of attachment has at least two connecting elements which are arranged together on the same carrier element. Preferably, the means of attachment has more than 10, in particular more than 25, connecting elements, which are arranged together on the same carrier element. The carrier element consequently has a multiplicity of protruding connecting elements on one side, for example columnar pins, hooks, eyes or other preferably elongated connecting elements, which protrude from the carrier element and at least some of which in each case establish an electrical connection with a further means of attachment or an electrical contact terminal of a further electronic component. Instead of elongated connecting elements, however, individual elements formed in some other way, for example particles of a granular material or powder, may also be provided on the carrier element. The rear side of the carrier element of the means of attachment, i.e., the side of the carrier element facing away from the connecting elements, is intended for the purpose of being placed on an electrical contact terminal of an electronic component, to be precise in such a way that it is in electrically conducting connection with the contact terminal. For example, it is possible to connect it to an electrical contact terminal thermally or with the aid of ultrasound or to attach it in a conducting manner by the action of a laser or by soldering or bonding.

It is preferably provided that the connecting elements are formed in a columnar manner and have a lateral surface that has a plurality of elevations. The connecting elements are formed for example as nanotubes or nanowires and in a way similar to bonding wires, but by contrast with the latter have a comparatively rough lateral surface. Such a lateral surface may be created by local action of a laser, in that regions of the lateral surface of the connecting elements are briefly liquefied, deformed and then cooled down again, or in that they are vaporized. As a result, a plurality of elevations is created. As an alternative to this, a rough surface of the connecting elements may be produced by the material of the connecting elements containing along with a main constituent also foreign inclusions of another, more readily volatile material. If a connecting element is produced at a temperature lower than room temperature and then heated up to room temperature or, as an alternative to this, produced at room temperature and heated up to a higher temperature, the more readily volatile material can evaporate and, as a result leave notches in the outer surface of the connecting elements.

As an alternative, hook-shaped elements may also be arranged on the lateral surface. It is preferably provided that the hook-shaped elements are arranged pointing toward the carrier element. Their outer tip is then facing the carrier element. The hook-shaped elements serve as barbs when the connecting elements of two means of attachment are brought together from opposite sides and engage in one another, or engage between one another.

It is preferably provided that, on a number of portions which are distributed over the length of the connecting elements, the connecting elements have in each case a locally increased cross section. In particular, the connecting elements may be formed in such a way that the cross-sectional area perpendicular to the length of the connecting element is greater than on other pieces of the connecting element.

In particular, it may be provided that the connecting elements have a circular cross section, the diameter of which is locally increased at a number of portions which are distributed over the length of the connecting elements. For example, annular thickenings of a cylindrical connecting element may be provided, these thickenings leading to a mechanical friction or mechanical resistance if, when an equivalent connecting element lies laterally against the connecting element, the two connecting elements are pulled apart along their longitudinal direction.

The connecting elements preferably have in each case a free end, it being possible for the connecting elements to have a thickening in each case at their free ends. Such thickenings may, for example, be formed in a drop-shaped manner. As an alternative, they may also be formed in a book-shaped manner or in some other way. Drop-shaped thickenings may be produced, for example, by the action of ultrasound or the action of a laser. A thickening at a free end of a connecting element may serve in a way similar to a barb for mechanical attachment if, as provided according to the invention, a plurality of connecting elements arranged closely next to one another are arranged on the means of attachment. At least some of these connecting elements engage between connecting elements of a further means of attachment when the latter is pressed on. This creates a mechanical connection in the same way as in the case of a Velcro® fastener, which however serves at the same time for electrical contacting, since the connecting elements are electrically conducting, at least on their surface.

It is preferably provided that the connecting elements are bent at their free ends. Elongated connecting elements of a further, pressed-on means of attachment may engage in the bent ends, so that they can only be released by exerting force.

It is preferably provided that the connecting elements have in each case a first region, which consists of a first material, and a second region, which consists of another, second material, the first region and the second region extending substantially over the entire length of the respective connecting element. In the case of this embodiment, the material composition of the connecting elements is not homogeneous, but at least two materials or material components are arranged separately within the body of the connecting elements.

According to one embodiment, it is provided that the first material and the second material are in each case metals or metallic compounds, the coefficient of thermal expansion of the first material being greater than that of the second material, and that the first region and the second region are distributed over the cross section of the connecting elements, perpendicular to the length of the connecting elements, in each case in a rotationally unsymmetrical manner. Here, the construction of an individual connecting element over its cross section is not rotationally symmetrical, so that, on account of the differing degrees of thermal expansion of the first and second materials, a thermally induced curvature of the entire connecting element occurs in the same way as in the case of a bimetal contact. As a result, each connecting element as a whole is curved and consequently serves like a barb for connecting elements engaging with a second means of attachment.

The connecting elements are, for example, small hairs, small hooks or other kinds of elongated, pin-shaped or filament-shaped elements that are electrically conducting and have a rough surface and/or a curved form, at least in certain regions.

It may be provided that the connecting elements have an inner core of a first material, which is surrounded by the second material, at least the second material being electrically conductive. Here, the connecting elements need only be electrically conducting in the region of their lateral surface. In particular, the inner core of the connecting elements may consist of a plastic which is coated with an electrically conductive material, for example a metal, such as for instance gold. The choice of material for the inner core of the connecting elements allows the extent of their flexibility and deformability to be influenced. The electrically conductive coating with the second material allows the means of attachment to be used for electrically contacting semiconductor devices.

An alternative embodiment provides that the connecting elements are bonding wires. They are preferably produced from gold, but may also consist of some other material. Although bonding wires are known per se, they are conventionally only used for the electrical connection of in each case one contact to in each case another contact. On the other hand, a Velcro® like attachment, in which a plurality of bonding wires are arranged on a common base, for example the carrier element of the means of attachment according to the invention or the contact terminal of a semiconductor device or of a printed circuit board, is not known. This is so because, conventionally, the free end of a bonding wire is in each case bonded with the aid of ultrasound to a second contact terminal. In the case of a Velcro® like connection with a plurality of small bonding wires, on the other hand, there is no need for connecting the free ends of the bonding wires; the roughened, curved or otherwise deformed bonding wires hook in one another.

In particular, it is provided that the connecting elements are curved, and in particular elastically deformable, over their entire length. Finally, it is provided that the carrier element of the means of attachment according to the invention consists of an electrically conductive material. The carrier element and the connecting elements arranged on one side of the carrier element may be formed in one piece.

In particular, it is provided that the connecting elements are pliable, that is to say elastically deformable. The connecting elements may, in particular, be pressure-resistant, i.e. oppose a pressure directed against the carrier element with a counterpressure. As a result, they are particularly well suited for directly contacting a contact terminal of a further electronic component or engaging in connecting elements of a further carrier element.

The object on which the invention is based is also achieved by an electronic component provided with the means of attachment described above. In the case of such a component with a plurality of electrical contact terminals, which have in each case a contact area, a means of attachment according to the invention is in each case placed on the contact areas of the respective contact terminals. The electronic component provided with the means of attachment can then be electrically connected to a further electronic component by simply pressing it on.

It is preferably provided that the means of attachment are in each case attached with an area of their carrier element that is facing away from the connecting elements on the contact area of the respective contact terminal. In this case, for example with a means of attachment which has the connecting elements on the upper side of the carrier element, the underside of the carrier element is attached on the contact area of a contact terminal of the electronic component. For example, the carrier element may be bonded onto the contact terminal. Each contact terminal of the electronic component is in this way provided with a means of attachment according to the invention.

It is preferably provided that the means of attachment are placed on the contact terminals in such a way that the connecting elements of the means of attachment are facing away from the electronic component. If, for example, the carrier elements of the means of attachment are placed on contact terminals which are arranged on an upper side of the electronic component, the connecting elements of the means of attachment likewise face upward, i.e. away from the upper side of the component. Consequently, a carrier element with a plurality of connecting elements arranged closely next to one another is placed on each contact terminal of the component, the contact elements in each case of a connecting means being intended for the purpose of engaging in an arrangement of connecting elements of a further means of attachment which is arranged on a contact terminal of another component.

Two contact terminals of two components are therefore electrically connected to one another by first placing an attaching element according to the invention on both contact terminals. The carrier element of the attaching element is, for example, bonded onto the respective contact terminal. Subsequently, the components are pressed against one another, the connecting elements that are facing one another engaging in one another or between one another when the two components are brought together In this case, the carrier element on the contact terminal of a first component is brought up to a carrier element on a contact terminal of a second component In this case, the connecting elements arranged on the carrier element of the first component engage in the connecting elements which are arranged on the carrier element of the second component, and vice versa. On account of the high number of connecting elements per carrier element on which they are arranged, it is not necessary for each of the connecting elements to engage in a corresponding connecting element of a further component. Instead it is sufficient that, in a way similar to a Velcro® fastener, an adequate number of connecting elements that are present engage with one another, for adequate mechanical and electrical connection The greater the number of connecting elements engaging in one another or hooking in one another, the lower the impedance of the contact connection.

Between each contact terminal and the means of attachment placed on it there may be provided an electrically conductive mass, which establishes the electrical connection between the two. This allows the means of attachment to be prefabricated and later applied to the contact terminals. As an alternative, connecting elements can in each case be placed individually on an exposed surface of each contact terminal, as explained later. In this case, it is possible in particular for a plurality of connecting elements to be placed in each case on each contact terminal, the connecting elements to be placed in each case on each contact terminal, the connecting elements not necessarily having to be elongated, but it also being possible for them to have dimensions that are approximately equal in all three spatial directions. They may, for instance, be preformed particles, for instance tetrahedral, octahedral, cuboidal or in some other way uniformly or differently formed particles, for example particles of a granular material or a powder.

The electronic component may be, for instance, an electronic printed circuit board, a semiconductor device or some other component.

The object on which the invention is based is also achieved by an arrangement with an electronic printed circuit board and with at least one semiconductor device, the semiconductor device and the electronic printed circuit board having in each case a plurality of electrical contact terminals, on which means of attachment of the kind described here are in each case placed, the connecting elements of means of attachment placed on the semiconductor device and connecting elements of connecting means placed on the electronic printed circuit board engaging in one another and, as a result, establishing electrically conducting connections between the contact terminals of the semiconductor device and the contact terminals of the electronic printed circuit board. Both the electronic printed circuit board and the memory device are provided with a means of attachment according to the invention on each contact terminal which is to be connected to a contact terminal of the other component respectively. The connecting elements of the means of attachment placed on the memory device engage in connecting elements of the means of attachment placed on the electronic printed circuit board. Consequently, the contact terminals of the memory device are in each case either electrically and mechanically connected to the contact terminals of the printed circuit board by pairs of two means of attachment engaging in one another or are electrically connected to one another by a single means of attachment which is placed on one of the two contact terminals and presses against the other contact terminal.

The object on which the invention is based is also achieved by an arrangement with an electronic printed circuit board and at least one semiconductor device, the semiconductor device and the electronic printed circuit board having in each case a plurality of electrical contact terminals, a means of attachment of the kind described here being placed in each case either on each electrical contact terminal of the electronic printed circuit board or on each electrical contact terminal of the at least one semiconductor device, and the means of attachment connecting in each case in a conducting manner a contact terminal of the electronic printed circuit board to a contact terminal of the semiconductor device.

It is preferably provided that the semiconductor device is additionally mechanically fixed on the electronic printed circuit board by an adhesive. Since the means of attachment proposed according to the invention establishes a mechanical connection which can also be released again if and when required by mechanical pulling, still stronger mechanical fixing, and in particular permanent spatial positioning, can be achieved with the aid of adhesive locations.

It is preferably provided that the adhesive is applied to regions of the surface of the semiconductor device and the electronic printed circuit board which lie outside the contact terminals of the semiconductor device and the electronic printed circuit board. In particular, adhesive locations at which adhesive is applied to the surface of the memory device and to the surface of the electronic printed circuit board (or of the further component connected to the memory device) are provided at the edge or at corners of an arrangement of a number of electrical contact terminals.

The adhesive preferably consists of a material which shrinks on curing. This development of the invention has the advantage that a pressure pressing the means of attachment according to the invention arranged on the two components against one another is achieved by the adhesive material. This pressing pressure not only serves as additional pressing contact, which is conducive to low-impedance electrical contacting, but creates in addition to the pressure produced by mechanical pressing of the components against one another a pressing of the connecting elements of the two means of attachment against one another that also persists after letting the components go, to be precise for as long as it takes for the adhesive to be cured completely. If the connecting elements are elastically deformable, i.e. pliable, the pressing pressure created by the adhesive can also persist after the curing of the adhesive. This development has the advantage of compensating in particular for mechanical and thermal stresses of electronic printed circuit boards or other components that lead to deformations of the surfaces of these components. It is ensured by an adhesive, the volume of which shrinks during the curing, that the electrical connection remains adequately low-impedance even under thermal and/or mechanical deformation of the component surfaces.

In particular, it is provided that the semiconductor device has an integrated semiconductor chip and a chip package, the contact terminals of the semiconductor device being arranged on the chip package. The semiconductor chip is preferably connected to the chip package by means of bonding wires. However, all other known connecting techniques, for example ball grid arrays, may also be used.

The object on which the invention is based is also achieved by a method for attaching a semiconductor device on an electronic printed circuit board, the method having the following sequence of steps:

a) providing a semiconductor device and an electronic printed circuit board, which have in each case a plurality of electrical contact terminals, and providing means of attachment of the kind described here, b) placing the means of attachment on the contact terminals of the semiconductor device and/or the electronic printed circuit board, and c) pressing the semiconductor device and the printed circuit board against one another in such a way that each of the means of attachment establishes an electrical connection between a contact terminal of the printed circuit board and a contact terminal of the semiconductor device.

In the method, the means of attachment according to the invention are first placed on the contact terminals to be connected to one another of at least one or more components, for example a semiconductor device and an electronic printed circuit board, for example by bonding the underside of the carrier elements onto the contact areas of the contact terminals. Then, the components to be connected to one another are simply pressed against one another, the connecting elements arranged on the carrier elements establishing a mechanical and—on account of their electrical conductivity—also electrical connection in the same way as in the case of a Velcro® fastener.

It may preferably be provided that, in step b), the means of attachment are placed both on contact terminals of the semiconductor device and on contact terminals of the electronic printed circuit board, so that, after step c), the connecting elements of means of attachment which are placed on the semiconductor device and connecting elements of means of attachment which are placed on the printed circuit board engage in one another. Similarly, it may be provided that means of attachment are placed exclusively on the printed circuit board or exclusively on one of the two electronic components; their connecting elements then press directly against the electrical contact terminals of the other electronic component, for instance a semiconductor device. A reliable electrical contact is in each case established also in this way.

It may preferably be provided that, before step c), an adhesive is applied to the first and/or the second electronic component, the adhesive fixing the two components relative to one another in a spatially unchanged position after said components are pressed against one another in step c). The one electronic component may be a semiconductor device with an integrated semiconductor chip and a chip package, the contact terminals of the semiconductor chip being arranged on the chip package. The semiconductor device may similarly be an unpackaged semiconductor chip, the electrical contact terminals of which are connected to an interconnect, which runs over a semiconductor substrate.

The object on which the invention is based is also achieved by a method for forming a means of attachment in each case on a plurality of electrical contact terminals of an electronic component, the method having the following steps:

a) providing an electronic component with a plurality of electrical contact terminals which have in each case an exposed contact area, and b) placing a plurality of electrically conductive particles on each contact terminal of the electronic component.

This allows connecting elements to be attached on the contact terminals even without the use of carrier elements. The connecting elements may be elongated, in particular columnar, or else have approximately the same dimensions in all three spatial directions. They may in each case be attached individually or in groups on a contact terminal in each case.

Preferably, a plurality of electrically conductive particles are provided in step a) and a multiplicity of the conductive particles are in each case placed on each contact terminal of the electronic component in step b). For example, in step a), the plurality of conductive particles are provided in the form of a granular material or a powder. For example, it is provided that, in step b), a quantity of the granular material or powder is in each case applied to the exposed contact area of each contact terminal. So it is possible in step b) for instance for a quantity of the granular material or powder to be scattered onto the exposed contact area of each contact terminal and to be permanently connected to the respective contact area by a subsequent processing step.

The particles of the granular material or powder may be uniformly or differently preformed particles, it being possible for example for a particle to have dimensions of approximately the same size in all three spatial directions. The particles may be tetrahedral, octahedral, cuboidal or preformed in some other way. They may similarly be nonuniformly shaped crystallites.

In particular, it is provided that the particles of the granular material or powder are in each case permanently connected to the contact areas of the contact terminals simultaneously during the same processing step. As an alternative, it may be provided that, in step b), the conductive particles are placed one after the other on the contact terminals of the electronic component, in each case a multiplicity, or at least a plurality, of conductive particles, for example more than 10 or more than 25, but in any event at least two particles per contact terminal, being placed on each contact terminal.

The conductive particles may be elongated connecting elements, which, in step b), are connected one after the other to the contact terminals of the electronic component.

The connecting elements are, for instance, nanotubes or microscopically/nanoscopically small hairs or hooks, which are arranged in large numbers and densely packed next to one another on each of the carrier elements. In particular, more than 10, preferably between 50 and 500, connecting elements may be arranged on each carrier element. With respect to the density of the connecting elements arranged next to one another on the respective carrier element, it may be provided that between 5 and 50% of the upper side of the carrier element on which the connecting elements are arranged is covered by the connecting elements. Consequently, an area of between 95 and 50% of the area of the upper side remains for the engaging of connecting elements of a further means of attachment. In particular in the case of wide thickenings or elevations on the surface of the connecting elements, less dense arrangements of connecting elements suffice to achieve adequate mechanical solidity after the further component is pressed on.

It is preferably provided that, before step c), an adhesive is applied to the semiconductor material and/or to the printed circuit board, which adhesive fixes the semiconductor device mechanically on the printed circuit board after the pressing-on in step c). In this case, an adhesive of a material which shrinks on curing of the adhesive is preferably applied. It may, for example, also be an epoxy adhesive, which contains a component which brings about shrinkage of the adhesive.

It is preferably provided that the semiconductor device has an integrated semiconductor chip and a chip package and that the contact terminals of the semiconductor device are arranged on the chip package. If, however, the carrier elements of the connecting means are bonded or placed in some other way directly onto the surface of an unpackaged semiconductor chip, the latter may also be connected directly to another component, for example an electronic printed circuit board.

Finally, it may be provided that the connecting means are bonded to the contact terminals of the at least one semiconductor device and the electronic printed circuit board.

BRIEF DESCRIPTION OF THE DRAWINGS

The invention is described below with reference to FIGS. 1 to 24, in which:

FIG. 1 shows a plan view of an electronic component,

FIG. 2 shows a perspective view of the component from FIG. 1 and means of attachment according to the invention arranged on it, FIG. 17 shows a flow diagram of a method according to the invention for attaching a semiconductor device on an electronic printed circuit board.

FIG. 1 shows a schematic plan view of an electronic component 10, to be specific an electronic printed circuit board 20. The electronic printed circuit board 20 may, for example, be a printed circuit board for a memory module which is populated with a plurality of semiconductor devices. Usually provided on an outer edge of the electronic printed circuit board 20 is a contact strip with electrical contacts, whereby the memory module can be connected to a motherboard or some other electronic device by being plugged in. The contact strip is not represented in FIG. 1. In the left-hand half of FIG. 1, semiconductor devices 30 mounted on the electronic printed circuit board 20 are represented. In the right-hand half of FIG. 1, the positions over which further semiconductor devices 30 are to be arranged are indicated by dashed lines. Within these dashed lines there can be seen arrangements of in each case a number of electrical contact terminals 21, to which the semiconductor devices 30 are to be electrically connected.

FIG. 2 shows a perspective view of a detail of the electronic printed circuit board 20 from FIG. 1. Two rows of electrical contact terminals 21 are represented, having in each ease a contact area 21a. The contact areas 21a (also referred to herein as contact surfaces) are to be electrically connected to contact terminals of semiconductor devices. In a front row of contact terminals 21 of the electronic printed circuit board 20 in FIG. 2, it can be seen that a means of attachment 1 according to the invention is in each case applied to these contact terminals 21, to be specific on their contact area 21a. The means of attachment 1 according to the invention, only schematically indicated in FIG. 2, has a carrier element, which establishes the surface-area connection to the contact area 21a of the contact terminals 21, and also connecting elements that are pin-shaped, formed in the manner of hairs or made elongated in some other way, which are arranged in considerable numbers next to one another on each carrier element and protrude from the carrier element FIG. 3 shows an enlarged perspective view of the means of attachment 1 according to the invention. This has a carrier element 2, which consists of a conductive material, such as for instance a thin metal film. Electrically conductive plastic films or other materials that have an adequately high electrical conductivity, may also be used for the carrier element 2. The carrier element 2 may be part of a strip or a band, which is elastically deformable, that is to say pliable. The pliability of the carrier clement may be a result of its small layer thickness, so that metals, metal alloys and other conductive metal-containing compounds may also come into consideration as the material for the carrier element 2. On one side of the carrier element for example the upper side, a plurality of connecting elements 3 are provided, to be specific elongated bodies that are pin-shaped, needle-shaped, tabular or made elongated in some other way. The connecting elements have an outer form, which in FIG. 3 is represented only in a simplified manner; only the main extent of the connecting elements 3 in the longitudinal direction is represented in FIG. 3. The longitudinal direction of the connecting elements 3 changes locally with the respective orientation of the corresponding portion of the connecting elements 3. If the connecting elements 3 are not elastically deformable, or only to a small extent, the longitudinal direction of the connecting elements 3 runs perpendicularly to the surface of the carrier element on which the connecting elements 3 are arranged.

FIG. 4 shows a cross-sectional view of a detail of the means of attachment according to the invention from FIG. 3. The connecting elements 3 are represented as shortened in terms of length in their longitudinal direction L; in practice, their length will be a multiple of the diameter, preferably much more than 10 times their diameter. The connecting elements 3 are provided with a lateral surface which has a plurality of elevations. In addition or as an alternative to this, the connecting elements 3 are curved. In addition, thickenings may also be provided at a free end of the respective connecting elements 3. By these measures or a combination of some of these measures, the connecting elements 3 obtain an outer form which makes it possible for the means of attachment 1 to be attached on a further, identical or complementary means of attachment. In this case, connecting elements of the further attaching element, which are facing the connecting elements 3 of the means of attachment 1 represented, engage and become hooked when the two means of attachment are brought up to and pressed against one another.

FIG. 5 is consequently not true to scale. Arranged on an outer surface which at the same time forms the lateral surface of the approximately rod- or pin-shaped connecting elements 3 are elevations 4, which protrude beyond the surrounding regions of the lateral surface. If connecting elements formed in the same way of a further means of attachment are inserted from above between the depicted connecting elements 3, the elevations 4 of the connecting elements 3 of the two means of attachment 1 hook in one another, so that the means of attachment can only be pulled apart again by mechanical pulling. Consequently, when two means of attachment according to the invention are joined together, there is a releasable mechanical connection. Since, furthermore, the connecting elements 3 and the carrier element 2 are conductive, or at least electrically conductive on their surface, an electrical connection by which the electronic components are connected to one another is thereby likewise established.

Figure 3:
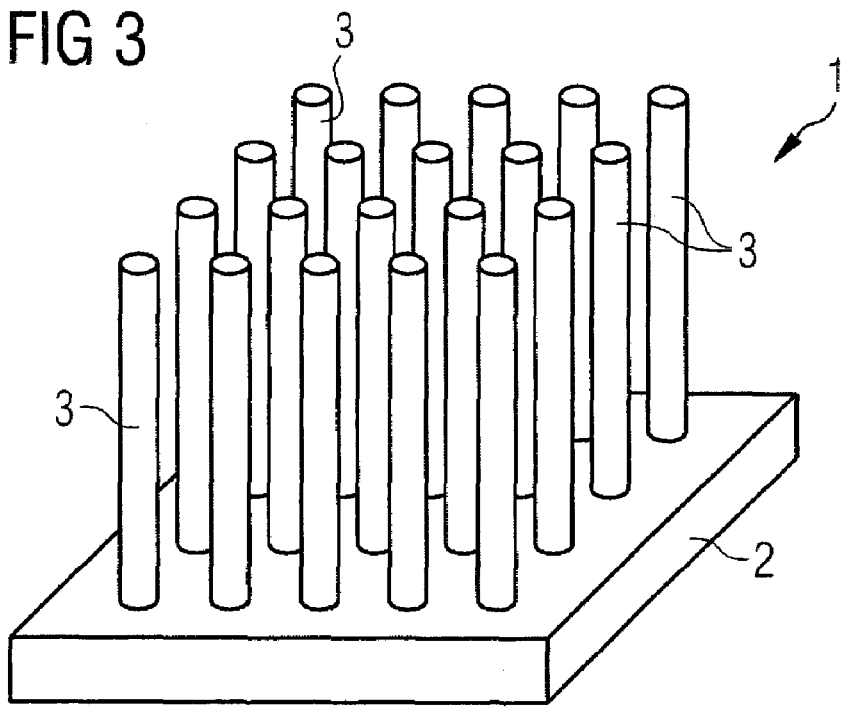
FIG. 3 shows a perspective view of the means of attachment according to the invention.
Figure 4:
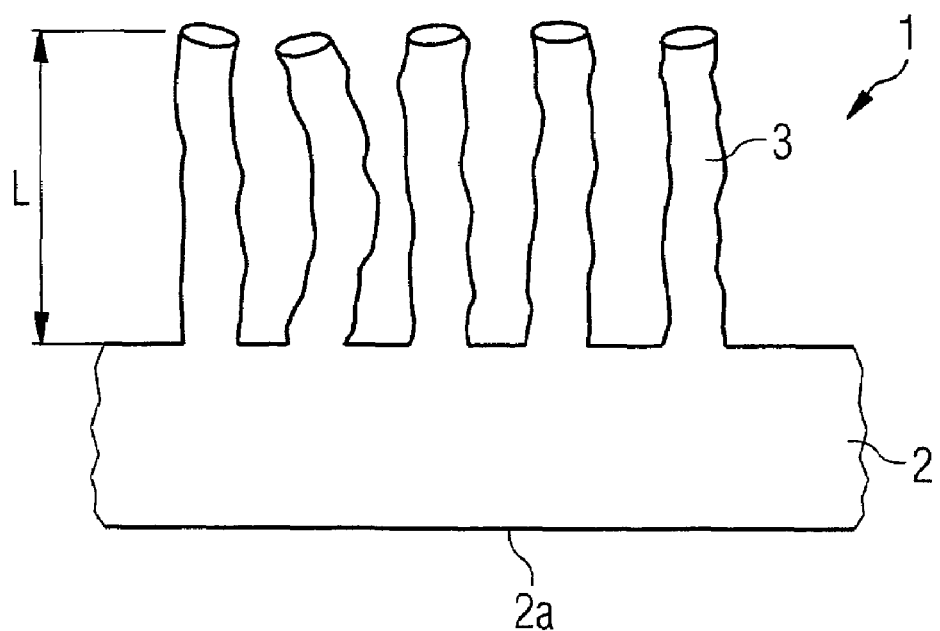
FIG. 4 shows a cross-sectional view of the means of attachment according to the invention from FIG. 3, FIGS. 5 to 11 show cross-sectional views of further, alternative embodiments of the means of attachment according to the invention.
Figure 5:
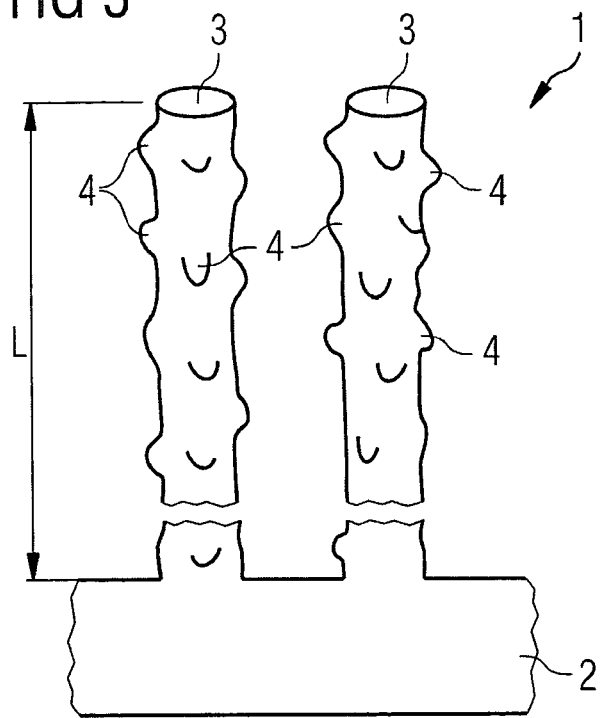
FIG. 5 shows a further embodiment of the connecting elements 3 of the means of attachment 1 according to the invention. The connecting elements 3 are represented as interrupted along their length. L.
Figure 6:
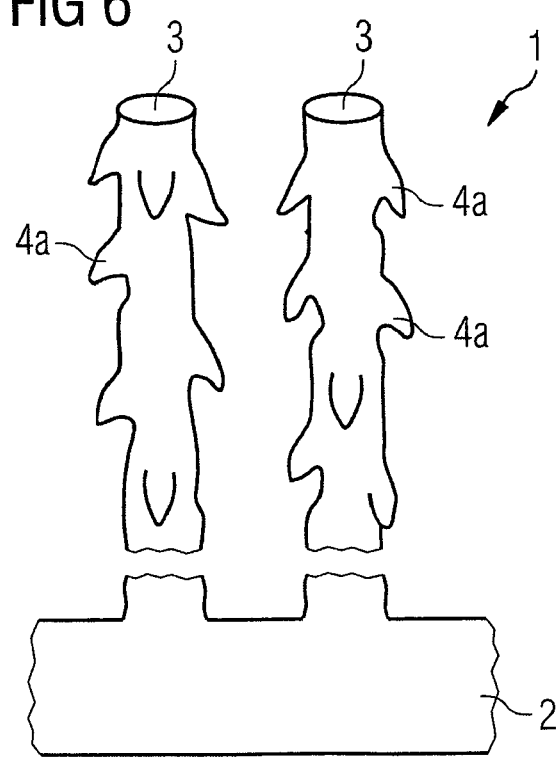
FIG. 6 shows a further embodiment of the connecting elements 3 of the means of attachment 1 according to the invention, in which hook-shaped elements 4a are formed on the lateral surface. The hook-shaped elements 4a point in the direction of the carrier element 2, on which the connecting elements 3 are arranged, so that, when they are pushed in or between connecting elements of a further means of attachment, they mesh with the latter and secure a permanent mechanical and electrical connection. As a result, a permanent electrical connection can be established by mechanical pressure being exerted once.
Figure 7:
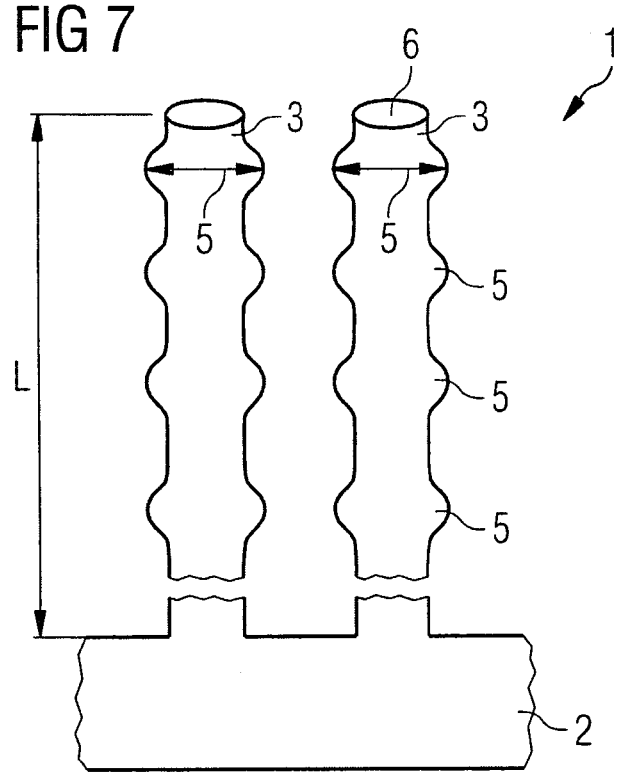
FIG. 7 shows an alternative embodiment of connecting elements of the means of attachment 1 according to the invention. The connecting elements 3 have an increased cross section 5 at a number of portions over their length L; at other portions in between, their cross section is comparatively smaller. The size of the cross section of the connecting elements 3 varies repeatedly between a smaller value and a larger value along the length L of the connecting elements. The outer profile obtained as a result, which lends the connecting elements 3 an outer structure along their longitudinal direction, serves the purpose that they mesh more easily with connecting elements of a further means of attachment brought up to them from the opposite direction.
Figure 8:
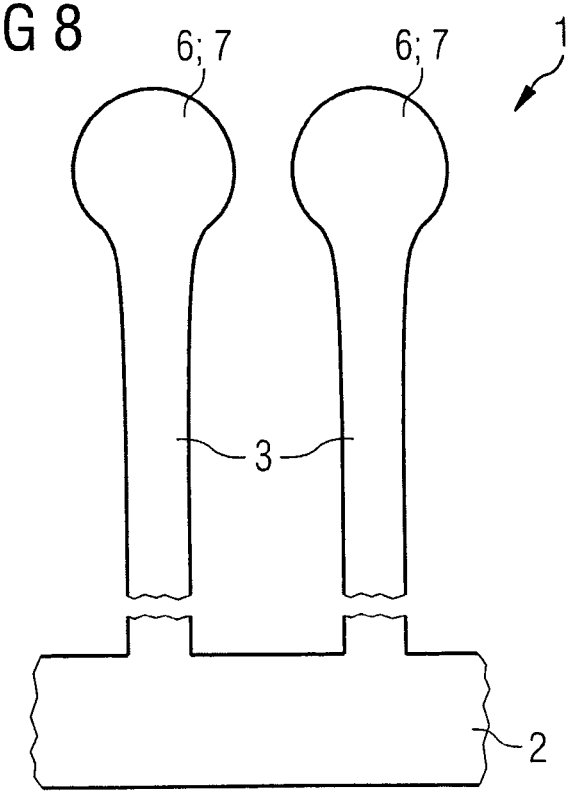
FIG. 8 shows an alternative embodiment of the connecting elements 3 of the means of attachment 1 according to the invention. The connecting elements 3 have a thickening 7 at a free end 6. This thickening may, for example, be formed in a drop-shaped manner. Such a form of the free ends 6 of the connecting elements 4 can be achieved by local action of a laser beam or by ultrasound.

In the case of a further alternative embodiment according to FIG. 9, the thickenings of the connecting elements 3 arranged at the free ends 6a are formed in a hook-shaped manner.

In particular, the connecting elements may have a circular cross section, the diameter of which is increased at a number of portions over the length of the respective connecting element.

FIG. 10 shows an embodiment in which the connecting elements 3 are curved. They are curved in particular at their respective free cad 6. If thickenings 7 are additionally arranged at the free ends 6, a particularly solid mechanical connection is achieved when two means of attachment I according to the invention are pressed together. In a way similar to in the case of a Velcro® fastener, the connecting elements 3 of two means of attachment 1 thereby hook in one another.

Figure 11:
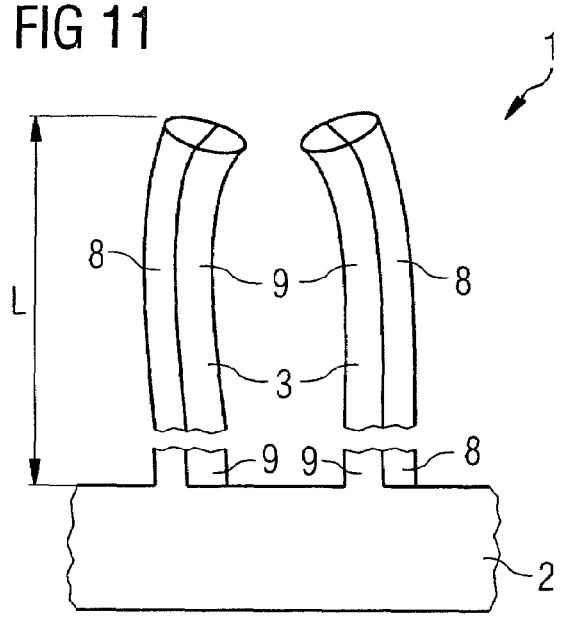

FIG. 11 shows an embodiment in which the connecting elements 3 consist of a number of materials. Represented are first regions 8 and second regions 9, the first regions 8 consisting of a 6rst material, the coefficient of thermal expansion of which has a first value, and the second regions 9 consisting of a second material, the coefficient of thermal expansion of which has another, second value, which is greater or less than the coefficient of expansion of the first material. The first regions 8 and the second regions 9 are ranged in a non-symmetrical way, in particular in a way that is not radially symmetrical, over the cross section through the connecting elements 3.

Figure 12:
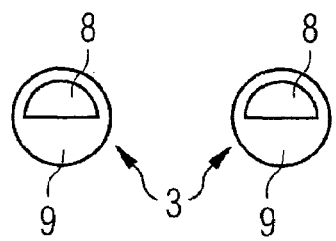
FIG. 12 shows a cross-sectional view of connecting elements of the means of attachment according to the invention from FIG. 11.

FIG. 12 shows in plan view such an arrangement that is not rotationally symmetrical of a number of materials within the connecting elements 3. The differing thermal expansion of the two materials leads to a curving and a bending of the connecting elements 3. A curvature reaching over their entire length L can be achieved as a result. To deform the connecting elements 3, it is sufficient for them to be brought into contact with connecting elements of a further means of attachment at a temperature other than the temperature at which they were produced.

Figure 13:
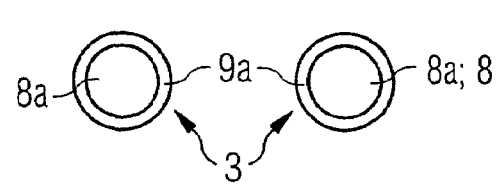
FIG. 13 shows a cross-sectional view of connecting elements of the means of attachment according to the invention according to another embodiment.

FIG. 13 shows a cross-sectional view perpendicular to the length of the connecting elements 3 according to another embodiment, in which the connecting elements 3 have an inner core 8a, which is surrounded by another, second material 9a. The inner core 8a consists of a material other than the surrounding second material 9a. In particular, the inner core 8a may consist of a plastic, the second material, which surrounds the core 8a, being a metal, such as for example gold, or a metal alloy. The conductively coated connecting elements 3 have the effect that adequately low-impedance electrical contacting is possible even in the case of plastics being used.

Figure 14:
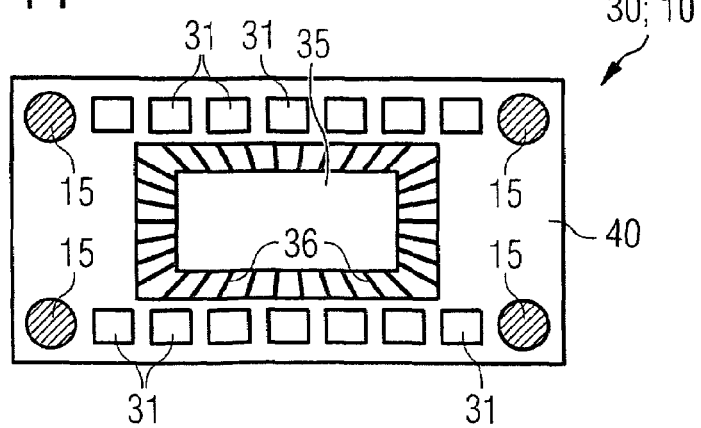
FIG. 14 shows a semiconductor device with an integrated memory chip on a chip package.

FIG. 14 shows a schematic plan view of en electronic component 10, to be specific a semiconductor device 30. The semiconductor device 30 has an integrated semiconductor chip 35 and a chip package 40. The semiconductor chip 35 is connected to the chip package 40, for example by bonding wires 36. Arranged on the chip package 40 are contact terminals 31, which are to be connected to contact terminals 21 of the electronic printed circuit board 20 from FIG. 1 or to contact terminals of another electronic or microelectronic component. Conventionally, such electrical connections are established with the aid of soldering methods, which however have a strong heating effect. As a consequence, dopant profiles of neighboring regions of the integrated semiconductor chip 35 can be distorted. To avoid such undesired dopant diffusions, the means of attachment according to the invention and their use for connecting electronic components to one another arc proposed. In particular in combination with an adhesive 15, which in FIG. 14 is represented in the finished state as being located near the periphery of the package, it is possible to achieve electrical and mechanical connections of a number of components to one another that works just as reliably as in the case of soldering methods but leads to far less thermal loading of the connected integrated semiconductor circuits.

Figure 15:
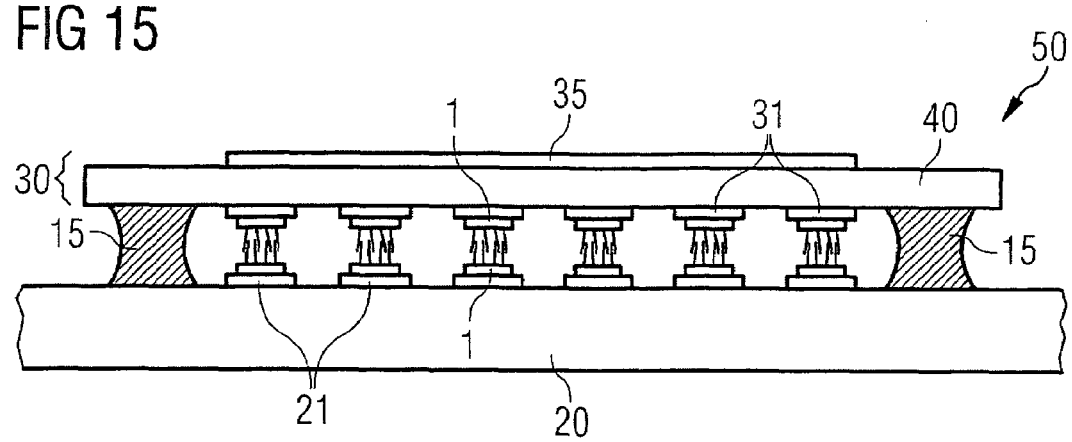
FIG. 15 shows an arrangement with an electronic printed circuit board, a semiconductor device and with means of attachment according to the invention.

FIG. 15 shows an arrangement 50, which has an electronic printed circuit board 20 and also a semiconductor device 30, which are mechanically connected to one another and electrically connected to one another with the aid of the means of attachment 1 according to the invention and with the aid of an adhesive 15.

As already represented in FIG. 14, the semiconductor device form FIG. 15 has an integrated semiconductor chip 35 and a chip package 40. The chip package 40 has electrical contact terminals 31. The electronic printed circuit board 20 has electrical contact terminals 21, which are mechanically and electrically connected to the contact terminals 31 of the chip package 40 by the means of attachment 1. Such a means of attachment 1 is in each case placed on each contact terminal 31 of the printed circuit board 20 and on each contact terminal 31 of the chip package 40. The carrier elements of the means of attachment 1 are preferably bonded onto the contact terminals 21, 31. The connecting elements of the electronic printed circuit board 20 and of the side of the chip package 40 engage here in one another, whereby a connecting means 1 placed on a contact terminal of the electronic printed circuit board is n each case electrically and mechanically connected to an opposite means of attachment placed on a contact terminal of the chip package 40. To additionally stabilize the spatial position of the chip package 40 and the electronic printed circuit board 20 with respect to one another, an adhesive 15, which consists in particular of a material which shrinks on curing of the adhesive, is applied at a number of locations. As a result, once the chip package is let go, after the latter has been pressed against the printed circuit board, the chip package is drawn further up against the printed circuit board 20 during the curing of the adhesive, and consequently the distance between the carrier elements on the chip package side and the carrier elements on the printed circuit board side of the means of attachment 1 is reduced. As a result, an adequately low-impedance electrical contact is ensured even in the case of later thermal and/or mechanical stresses of the printed circuit board 20 or the chip package 40.

Figure 16:
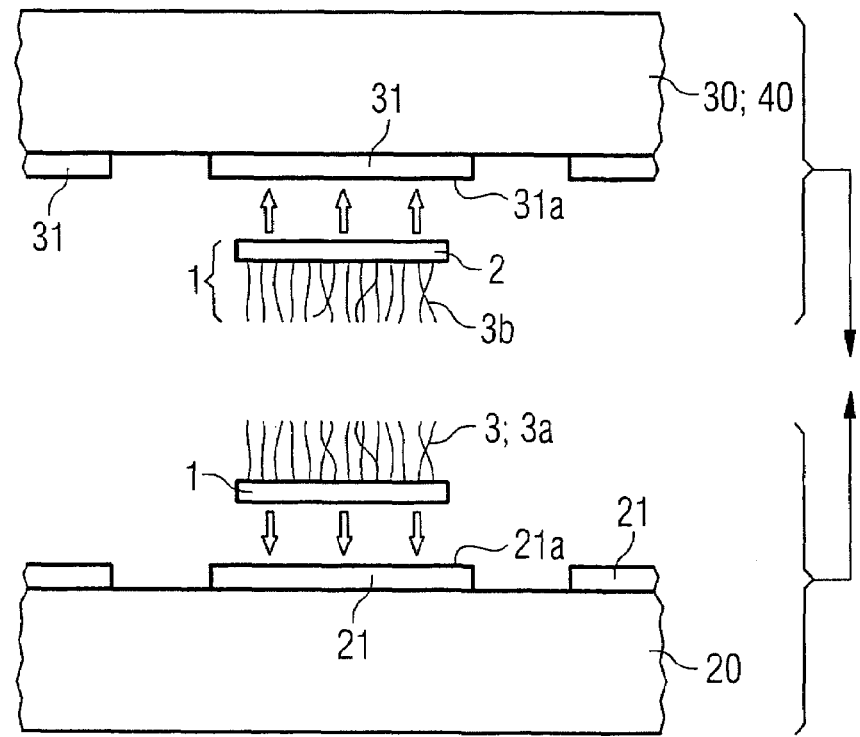
FIG. 16 shows a detail of the components represented in FIG. 15 before joining together.

According to FIG. 16, in which the connecting element 1 according to the invention depicted in FIG. 15 is represented as still detached from the electronic printed circuit board 20 and from the chip package 40, these connecting elements 3 are first placed on their contact terminals 21, 31. They are, for example, bonded onto the main areas 21a, 31a of the contact terminals 21, 31 or attached in some other way. Subsequently, the electronic printed circuit board 20, provided with the first means of attachment 1, and the semiconductor device, provided with second, further connecting means, are pressed together, so that the connecting elements 3a of the first connecting means, mounted on the printed circuit board 20, and the connecting elements 3b of the second connecting means 1. mounted on the semiconductor device 30, engage in one another and/or book in one another. The resultant Velcro® like connection, which on account of the electrical conductivity of the means of attachment I at the same time represents electrical contact, is additionally secured by the connecting locations of adhesive represented in FIGS. 14 and 15.

FIG. 17 schematically shows a flow diagram of a method according to the invention. First, the semiconductor device 30, the electronic printed circuit board 20 and the attaching elements 1 according to the invention, which have in each case a carrier element 2 and a plurality of connecting means 3 arranged on it, are provided. Then, the means of attachment 1 are placed on the contact terminals 21 of the printed circuit board 20 and on the contact terminals 31 of the semiconductor device. In addition, an adhesive, which is preferably formed from a material which shrinks on curing of the adhesive, is applied to the semiconductor device 30, to the electronic printed circuit board 20 or both to the semiconductor device and to the printed circuit board. Then, the semiconductor device 30 and the electronic printed circuit board 20 are pressed against one another, these being oriented in relation to one another in such a way that the connecting elements 3a, 3b of the means of attachment placed on their contact terminals are facing one another. When they are pressed together, the connecting elements 3a and the connecting elements 3b engage, hook and/or mesh in one another. Although this does not take place in the case of all the connecting elements 3a, 3b, it does take place in the case of such a large number of them that an adequate mechanical connection and adequately low-impedance electrical contacting are obtained. The additionally applied adhesive brings about additional fixing of the spatial position of the semiconductor device 30 in relation to the printed circuit board 20. If the adhesive 15 contains a material which shrinks on curing, this is conducive to a better electrical and mechanical contact of the printed circuit board 20 and the semiconductor device 30 with one another in the case of later thermal and/or mechanical deformations, for example of the printed circuit board.

With the aid of the method according to the invention, it is possible in particular for leadframes to be attached on printed circuit boards reliably and with the least possible thermal loading. The electrical/mechanical connection established according to the invention is reversible, i.e. it can be disconnected again without damaging the components connected to one another, in that the means of attachment 1 engaging in one another of the components thereby connected, for example a semiconductor device 30 and a printed circuit board 20, are pulled apart again. For this purpose, if an adhesive 15 is additionally applied, an adhesive that allows itself to be detached again without damaging the printed circuit board or the semiconductor device 30 may be used.

Figure 18:
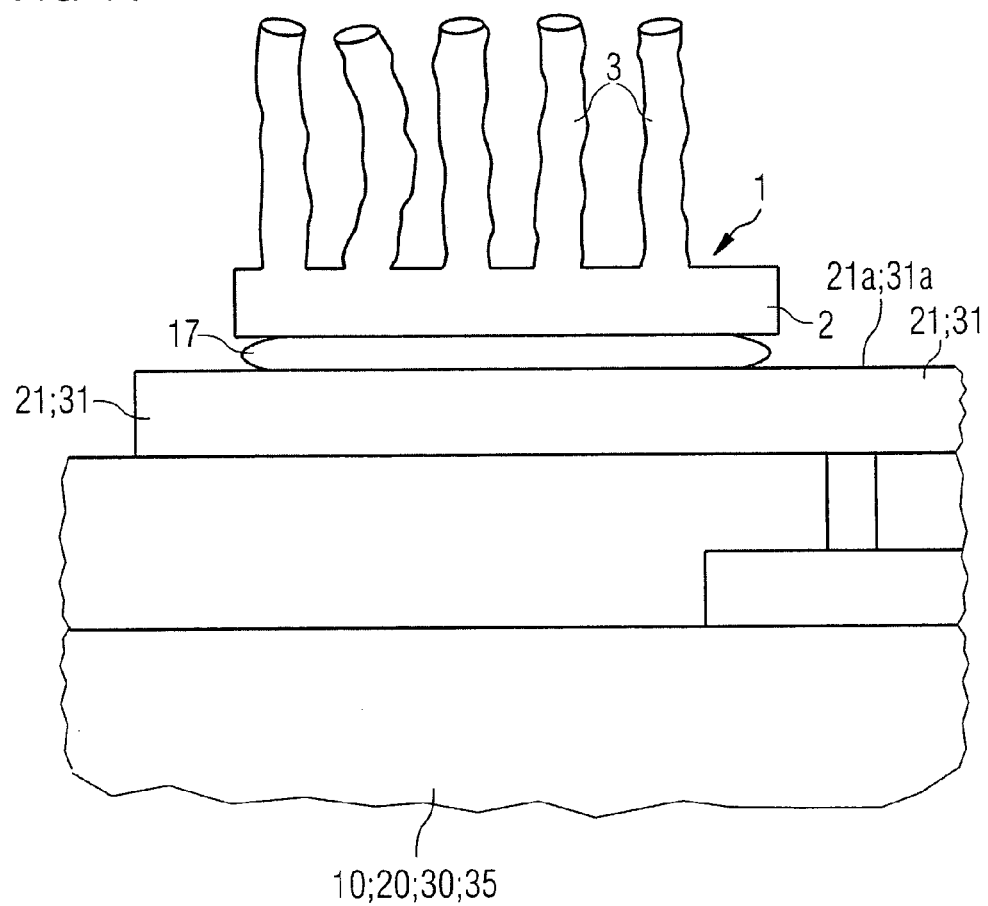
FIG. 18 shows a schematic cross-sectional view of an electronic component with a means of attachment according to the invention.

FIG. 18 shows a schematic cross-sectional view of an electronic component with a means of attachment according to the invention. The means of attachment 1 may, for example, be placed on an electrical contact terminal of an electronic component 10, for example on a contact terminal 21 of an electronic printed circuit board or a contact terminal 31 of a semiconductor device 30 (for example a semiconductor chip 35). For this purpose, apart from the electronic component 10, first a plurality of means of attachment 1 according to the invention are provided. The means of attachment 1 may be formed according to various embodiments, as described above; furthermore, they may be designed and produced according to one of the embodiments described with respect to the figures below. The means of attachment 1 is attached, for example with the aid of a conductive mass 17, on the exposed contact area 21a or 31a. The conductive mass may be, for example, solder tin or a metal, for example gold. A means of attachment according to the invention is placed on each and every contact terminal 21 or 31. On account of its connecting elements 3 or on account of particles which are provided in place of the connecting elements 3, the means of attachment is suitable for the purpose of contacting a further contact terminal of a further electronic component to be placed on top. In this case, a further, conversely oriented means of attachment may also be arranged on each contact terminal to be placed on top, which further means of attachment engages with the means of attachment that is placed on the contact terminal 21 or 31.

As an alternative, the pressure stability of the connecting elements 3 of the means of attachment 1 (or the particles provided in place of the connecting elements 3) may also be exploited in order to contact directly a contact terminal of a further electronic component that is to be placed on top. In these cases, no means of attachment are required on the contact terminals of the further electronic component. On account of the pressure stability of the connecting elements or the particles, when the two components are pressed against one another a counterpressure is created, contacting the electrical contact terminal of the further components at many locations of its exposed contact areas. In particular in combination with an adhesive to be additionally provided between the two components, a permanent counterpressure can be maintained between the electrical contacts of the two components, in particular in the case of an adhesive which contains a shrinkable material. Such a material shrinks on curing and thereby reduces the distance between the contact terminals arranged on the two components. As a result, the connecting elements 3 or the particles to be provided in their place are exposed to a pressure which ensures permanent contacting.

The electronic component 10 represented in FIG. 18 may be, for example, an electronic printed circuit board 20 or a semiconductor device 30, for example an unpackaged semiconductor device (a semiconductor chip 35). As an alternative, the semiconductor device 30 may also be a packaged semiconductor chip, on the chip package of which the contact terminals 31 are arranged.

Preferably, a means of attachment 1 according to the invention is in each case placed on each contact terminal 21 or 31 of the electronic component 10. The contact terminals 31 and 21 provided as a result may be connected, for example by conducting structures, to a deeper-lying semiconductor substrate, as indicated in FIG. 18.

Figure 19:
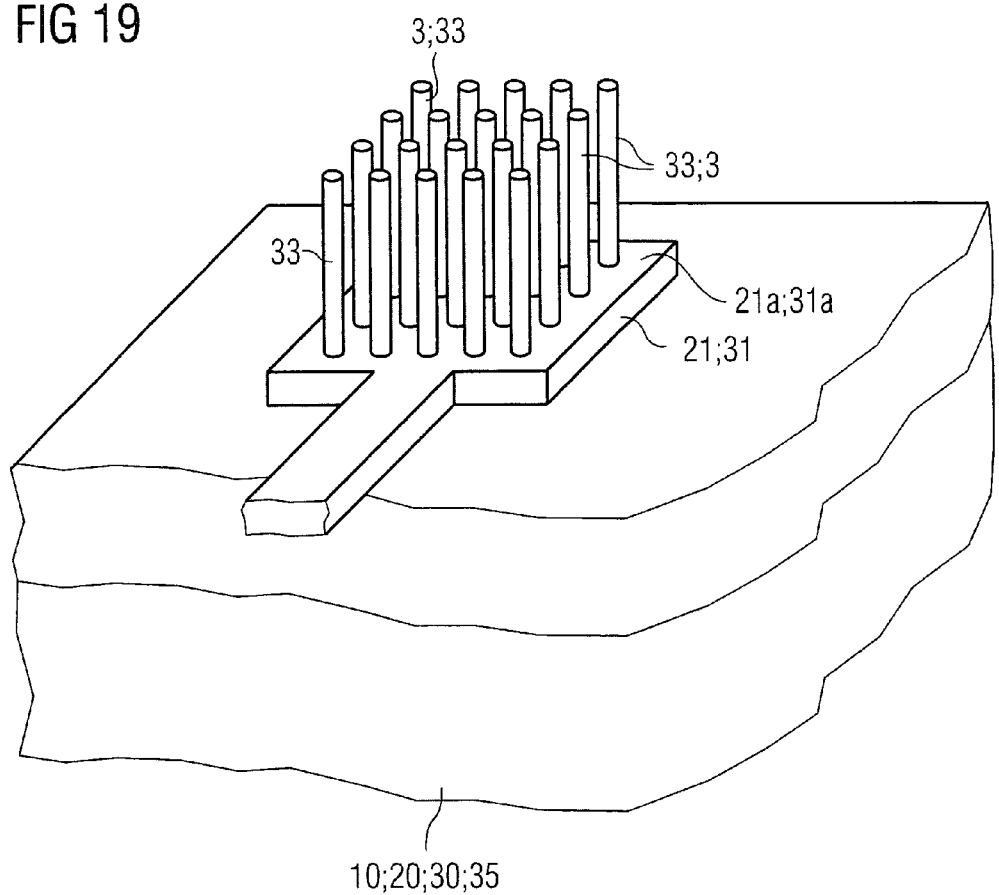
FIG. 19 shows a further embodiment of an electronic component with a means of attachment according to the invention.

FIG. 19 shows a further embodiment of an electronic component with a means of attachment according to the invention. In the case of the embodiment according to FIG. 19, the connecting elements 3 are not connected to a carrier element from the outset. Instead, the exposed contact area 21a or 31a of a contact terminal 21 or 31 serves as a carrier element or carrier for the multiplicity of connecting elements 3 to be placed in each case. The contact terminal may be the aid of an exposed interconnect that runs on an upper side of the electronic component 10. The electronic component may, in turn, be a printed circuit board 20, a semiconductor device 30 and, in particular, a semiconductor chip 35. On each contact terminal 21 or 31, only a single one of which is represented in FIG. 19, a multiplicity of connecting elements 3 are attached in each case, for example at least 3 or at least 4. The connecting elements 3 may be, for example, portions of a thin wire, for example a bonding wire or a still thinner wire, which are attached one after the other on the contact area 21a or 31a for example by a dedicated processing step 60 (FIG. 22). The processing step 60 may involve the use of ultrasound, thermal action or a laser; furthermore, the connecting elements 3 may be bonded or soldered onto the contact area. The individual elements to be placed in this way do not necessarily have to be formed as elongated connecting elements 33, as they are represented in FIG. 19. They may similarly be formed as particles 13 shaped in some other way (cf. FIG. 21), in particular as patties that have approximately the same dimensions in all three spatial directions. For example, tetrahedral, octahedral or cuboidal particles could be applied to the contact area; similarly, irregularly shaped particles of a granular material or powder can be used in place of preformed particles. Their grains or particles can likewise be attached in large numbers on all the contact terminals 21 or 31, as described below on the basis of FIGS. 20 to 22.

Figure 20:
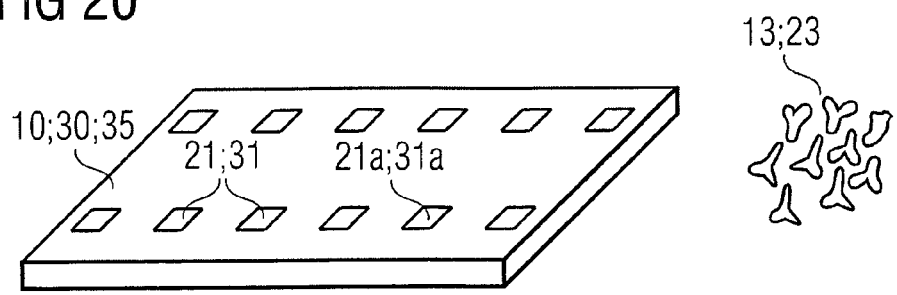
FIGS. 20 to 22 show a method for placing particles of a granular material or powder on contact terminals of an electronic component.

FIG. 20 shows a perspective view of an electronic component 10, for example a semiconductor device 30 and in particular a semiconductor chip 35. The electronic component 10 has a multiplicity of electrical contact terminals 21 or 31-Furthermore, it is schematically represented in FIG. 22 that a granular material 23 or powder, which has a multiplicity of individual particles 13 is provided. As represented in FIG. 20, these particles may have approximately equal dimensions in all three spatial directions. In this case2 no elongated connecting elements are used; surface-area connecting elements are also not used, but instead particles of a granular form, which, if they are scattered on a respective contact area 21a 31a, represent a clear elevation with respect to the surrounding surface. They serve the purpose of conductively connecting two electrical contact terminals to one another in each case when two semiconductor devices are pressed against one another.

Figure 21:
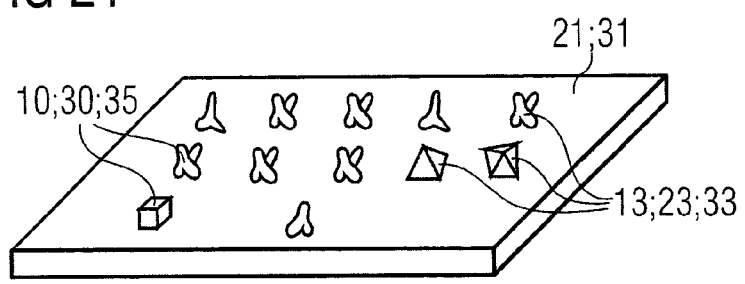
Figure 22:
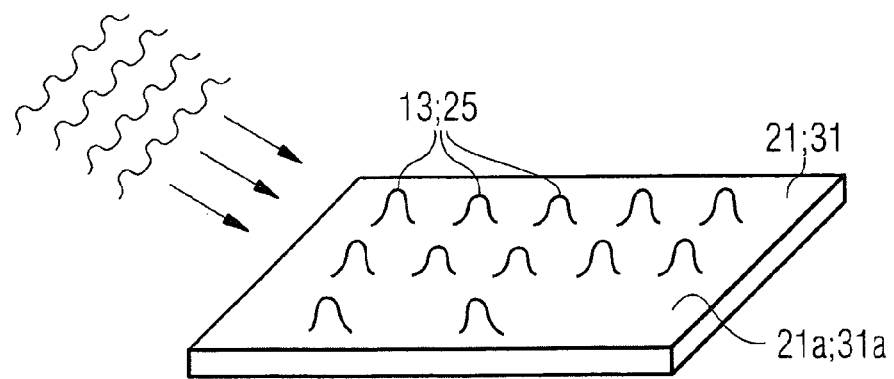

According to FIG. 21, a granular material (or powder) 23 of electrically conductive particles 13 is scattered onto each contact terminal 21 or 31 of an electronic component. Subsequently, the particles 13 are permanently attached on the respective contact terminal 21 or 31, as still to be explained on the basis of FIG. 22. For example, the particles, which are all electrically conductive, may be fused onto the surface of the respective contact terminal. As an alternative, ultrasound or a laser beam may be used for permanently attaching the particles on the surface of the contact terminal. These three types of processes may also be combined with one another. Furthermore, the particles may be soldered or bonded onto the respective contact terminal. In all cases, a surface of the treated contact terminal such as that represented in FIG. 22 is obtained as a result. Formed on it are elevations 25 with respect to the originally planar contact area 21a or 31a of the respective contact terminal 21 or 31, originating from the fused-on or otherwise permanently attached particles 13 of the granular material 23 or powder. If it is pressed against a contact terminal of a flintier electronic component, a contact terminal treated in this way is suitable for contacting the latter.

Figure 23:
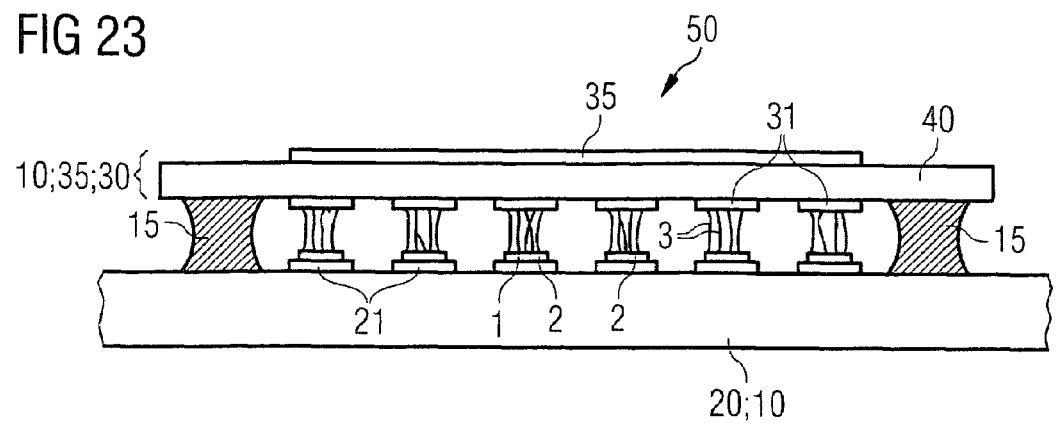
FIG. 23 shows an alternative arrangement with two electronic components, which are attached to one another with the aid of means of attachment according to the invention.

FIG. 23 shows such an exemplary embodiment in which only the contact terminals 21 of a first electronic component 10, for instance a printed circuit board 20, are provided with particles 3 or means of attachment or connecting elements formed in some other way. The second electronic component 10, which may for instance be a semiconductor device 30, in particular a semiconductor chip 35, has electrical contact terminals 31, which have not been provided with means of attachment according to the invention (or particles of a granular material or powder or other elements) before the two components 10 are pressed against one another. Represented in fact in FIG. 23 is a situation in which means of attachment 1 according to the invention (with a carrier element and a multiplicity of connecting elements 3) is in each case only arranged on the contact terminals 21 exclusively of one of the two electronic components (as an alternative, as represented in FIG. 19, the connecting elements 3 may be provided directly on the contact areas of the contact terminals 21; furthermore, particles 13 of a granular material or powder may in each case be arranged in place of the connecting elements 3, as represented in FIGS. 21 and 22)4

In all cases, located on the contact terminals 21 of an electronic component are upwardly pointing individual elements (in FIG. 23, for example, elongated connecting elements 3 are represented), the upper ends of which point upward and press against the contact terminals 31 of the second electronic component 10. In particular when adhesive 15 is used in further regions of the main areas of the two electronic components, for example at the edge of the main areas of the components 10. a permanent counterpressure of the upper electronic component on the lower component can be maintained, with which the connecting elements 3 (or particles 13) exert a counterpressure against the contacts 31 of the upper component 10 on account of their pressure resistance, and as a result contact the respective contact terminals 31.

Figure 24:
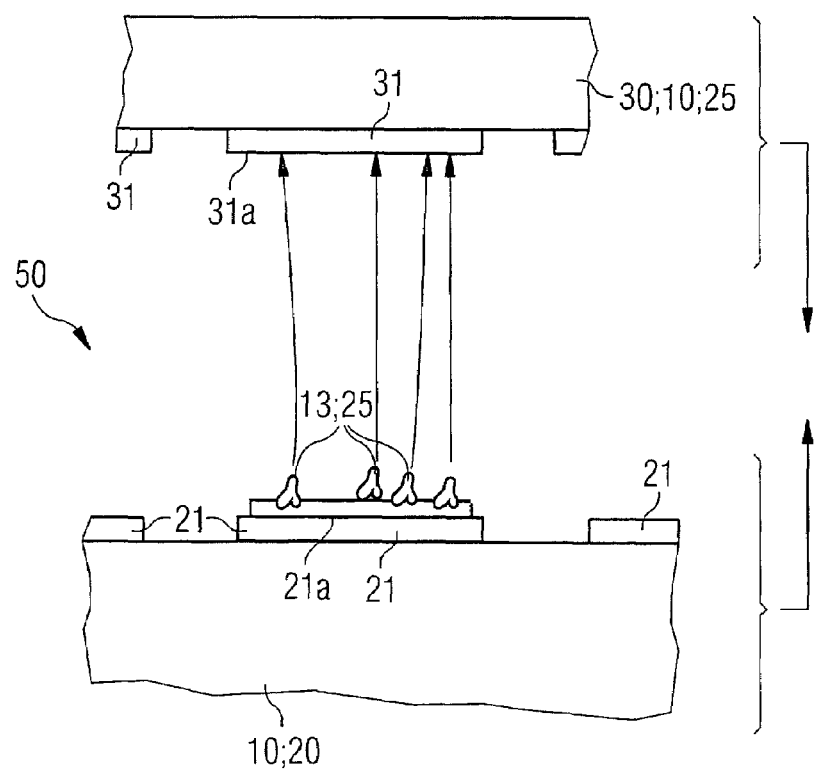
FIG. 24 shows an embodiment as an alternative to FIG. 23 in an enlarged view of a detail.

In FIG. 24, an arrangement according to FIG. 23 is represented in an enlarged view of a detail, to be precise for the case where particles 13 of a powder are in each case provided in place of the elongated connecting elements 3. The particles 13 may, for example, be placed directly on the contact area 21a of the contact terminal 21 of a first component 10 and, when the two semiconductor devices are joined together, press against the contact areas of the contact terminals 31 of the second component. As also in the case of the previous embodiments, a multiplicity of particles or connecting elements arc in each case provided for each contact terminal, in order to ensure reliable contacting.

LIST OF DESIGNATIONS 1 means of attachment
2 carrier element
2a surface net
3; 3a, 3b; 33 connecting element
4 elevation
4a hook-shaped element
5 enlarged cross section
6; 6a free end
7 thickening
8 first region 8a first material
9 second region
9a second material
10 electronic component
13 particles
15 adhesive
17 conductive mass
20 electronic printed circuit board
21 contact terminal
21a; 31a contact surface
23 granular material
25 elevation
30 semiconductor device
31 contact terminal
35 semiconductor chip
36 bonding wires
40 chip package
50 arrangement
60 processing step
L length

The invention claimed is:

1. A means of attachment for electrically contacting electronic components, the means of attachment comprising:
a carrier element; and
a plurality of elongated connecting elements, each of the connecting elements arranged on the carrier element and having an elongated body, the elongated body protruding from the carrier element, each of the connecting elements and the carrier element including an electrically conductive surface;
wherein each of the connecting elements has a first region, which consists of a first material, and a second region, which consists of a second material, the first region and the second region extending substantially over the entire length of the connecting element; and
wherein the first material and the second material are metals or metallic compounds, the coefficient of thermal expansion of the first material being greater than that of the second material, and the first region and the second region being distributed over the cross section of the connecting elements, perpendicular to the length of the connecting elements, in a rotationally unsymmetrical manner.

2. The means of attachment as claimed in claim 1, wherein the means of attachment is formed in one piece of the carrier element and the plurality of connecting elements.

3. The means of attachment as claimed in claim 1, wherein the carrier element and the connecting elements have a common body.

4. The means of attachment as claimed in claim 1, wherein the carrier element is formed of the same material as the connecting elements.

5. The means of attachment as claimed in claim 1, wherein the carrier element and the connecting elements are formed of a metal or metal alloy.

6. The means of attachment as claimed in claim 1, wherein the means of attachment provides mechanical attachment of electronic components to one another.

7. The means of attachment as claimed in claim 1, wherein the connecting elements have a shape suitable for engaging or hooking in between connecting elements of a further means of attachment.

8. The means of attachment as claimed in claim 1, wherein the connecting elements are elastically deformable.

9. The means of attachment as claimed in claim 1, wherein the connecting elements are formed of ultrafine wires.

10. The means of attachment as claimed in claim 9, wherein the connecting elements have a diameter of between 0.1 and 10 micrometers.

11. The means of attachment as claimed in claim 1, wherein the means of attachment has two or more than two (2) connecting elements, which are arranged together on the same carrier element.

12. The means of attachment as claimed in claim 11, wherein the means of attachment has more than ten (10) connecting elements, which are arranged together on the same carrier element.

13. The means of attachment as claimed in claim 12, wherein the means of attachment has more than twenty-five (25) connecting elements, which are arranged together on the same carrier element.

14. The means of attachment as claimed in claim 1, wherein the connecting elements are formed in a columnar manner and have a lateral surface which has a plurality of elevations.

15. The means of attachment as claimed in claim 1, wherein the connecting elements are formed in a columnar manner and have a lateral surface on which hook-shaped elements are arranged.

16. The means of attachment as claimed in claim 15, wherein the hook-shaped elements are arranged pointing toward the carrier element.

17. The means of attachment as claimed in claim 1, wherein, on a number of portions which are distributed over the length of the respective connecting element, each of the connecting elements have a locally increased cross section.

18. The means of attachment as claimed in claim 1, wherein the connecting elements have a circular cross section, the diameter of which is locally increased at a number of portions which are distributed over the length of the connecting elements.

19. The means of attachment as claimed in claim 1, wherein each of the connecting elements has a thickened free end.

20. The means of attachment as claimed in claim 1, wherein each of the connecting elements has a free end, the free ends of the connecting elements being shaped like a hook.

21. The means of attachment as claimed in claim 19, wherein the connecting elements are bent at their free end.

22. The means of attachment as claimed in claim 1, wherein the attaching elements have an inner core of the first material, which is surrounded by the second material, at least the second material being electrically conductive.

23. The means of attachment as claimed in claim 22, wherein the inner core of the attaching elements comprises a plastic.

24. The means of attachment as claimed in claim 22, wherein the second material comprises gold.

25. The means of attachment as claimed in claim 1, wherein the connecting elements are bonding wires.

26. The means of attachment as claimed in claim 1, wherein the connecting elements are curved over their entire length.

27. The means of attachment as claimed in claim 1, wherein the connecting elements are resistant to pressure, which is applied in a direction perpendicular to the surface of the carrier element.

28. The means of attachment as claimed in claim 1, wherein the carrier element comprises an electrically conductive material.

29. An electronic component comprising:
a plurality of electrical contact terminals, each contact terminal having a contact surface, and
a means of attachment being placed on each contact surface, the means of attachment comprising:
a carrier element; and
a plurality of elongated connecting elements, each of the connecting elements arranged on the carrier element and having an elongated body, the elongated body protruding from the carrier element, each of the connecting elements and the carrier element including an electrically conductive surface;
wherein the means of attachment is attached with a surface of the carrier element opposed to the surface from which the connecting elements protrude.

30. The electronic component as claimed in claim 29, wherein the means of attachment is placed on the contact terminals in such a way that the connecting elements are facing away from the electronic component.

31. The electronic component as claimed in claim 29, wherein the carrier elements of the means of attachment are bonded or soldered onto the contact terminals.

32. The electronic component as claimed in claim 29, wherein the carrier elements of the means of attachment are soldered onto the contact terminals.

33. The electronic component as claimed in claim 29, wherein the electronic component is electrically connected to the carrier element by an electrically conductive material arranged on a surface of each of the carrier elements opposed to the surface from which the connecting elements protrude.

34. The electronic component as claimed in claim 29, wherein the electronic component components is an electronic printed circuit board.

35. The electronic component as claimed in claim 29, wherein the electronic component components is a semiconductor device.

36. The electronic component as claimed in claim 35, wherein the semiconductor device is a packaged semiconductor chip.

37. The electronic component as claimed in claim 35, wherein the semiconductor device is an unpackaged semiconductor chip.

38. An arrangement comprising:
a means of attachment for electrically contacting electronic components, the means of attachment comprising:
a carrier element; and
a plurality of elongated connecting elements, each of the connecting elements arranged on the carrier element and having an elongated body, the elongated body protruding from the carrier element, each of the connecting elements and the carrier element including an electrically conductive surface;
an electronic printed circuit board;
at least one semiconductor device, the semiconductor device and the electronic printed circuit board each having a plurality of electrical contact terminals on which the means of attachment is placed;
the connecting elements of the semiconductor device and the printed circuit board engaging with one another, whereby the means of attachment establish electrically conducting connections between the contact terminals of the semiconductor device and the contact terminals of the electronic printed circuit board; and
wherein the semiconductor device is additionally attached on the electronic printed circuit board by an adhesive.

39. The arrangement as claimed in claim 38, wherein the adhesive is applied to regions of the surface of the semiconductor device and the electronic printed circuit board that lie outside the contact terminals of the semiconductor device and the electronic printed circuit board.

40. The arrangement as claimed in claim 38, wherein the adhesive contains a material which shrinks on curing.

41. The arrangement as claimed in claim 38, wherein the semiconductor device has an integrated semiconductor chip and a chip package, the contact terminals of the semiconductor device being arranged on the chip package.

42. The arrangement as claimed in claim 38, wherein the semiconductor device has an unpackaged semiconductor chip, on the contact terminals of which the means of attachment are placed.

43. A method for attaching a semiconductor device on an electronic printed circuit board, the method comprising:
providing a semiconductor device and an electronic printed circuit board, each having a plurality of electrical contact terminals;
providing a plurality of means of attachment, the plurality of means of attachment comprising a carrier element and a plurality of elongated connecting elements, each of the connecting elements arranged on the carrier element and having an elongated body, the elongated body protruding from the carrier element, each of the connecting elements and the carrier element including an electrically conductive surface;
placing the means of attachment on the contact terminals of the semiconductor device and/or on the electronic printed circuit board; and
pressing the semiconductor device and the printed circuit board against one another in such a way that each of the means of attachment establishes an electrical connection between a contact terminal of the printed circuit board and a contact terminal of the semiconductor device.

44. The method as claimed in claim 43, wherein the means of attachment is placed both on contact terminals of the semiconductor device and on contact terminals of the electronic printed circuit board, so that, after pressing the semiconductor device and the printed circuit board against one another, the connecting elements engage with one another.

45. The method as claimed in claim 44, wherein before the connecting elements engage with one another, an adhesive is applied to the semiconductor device and/or to the printed circuit board, the adhesive fixing the semiconductor device spatially with respect to the printed circuit board after they are pressed against one another.

46. The method as claimed in claim 43, wherein the semiconductor device has an integrated semiconductor chip and a chip package and wherein the contact terminals of the semiconductor device are arranged on the chip package.

47. An electronic component with electrical contact terminals, each of which has a contact surface, a plurality of elongated connecting elements being placed on the contact surface of each respective contact terminal;
wherein the connecting elements are formed in a columnar manner and have a lateral surface which has at least one elevated surface; and
wherein the at least one elevated surface comprises a thickening.

48. The electronic component as claimed in claim 47, wherein the connecting elements are elastically deformable.

49. The electronic component as claimed in claim 48, wherein the connecting elements are pieces of wire with a diameter of between 0.1 and 10 micrometers.

50. The electronic component as claimed in claim 47, wherein each of the connecting elements has a free end with a thickening at the free end.

51. The electronic component as claimed in claim 50, wherein the connecting elements are bent at their free end.

52. An electronic component with electrical contact terminals, each of which has a contact surface, a plurality of elongated connecting elements being placed on the contact surface of each respective contact terminal; wherein the connecting elements each have a first region, which comprises a first material, and a second region, which comprises a different second material, the first region and the second region extending substantially over the entire length of the connecting element; and wherein the first material and the second material comprise metals or metallic compounds, the coefficient of thermal expansion of the first material being greater than that of the second material, and the first region and the second region being distributed over the cross section of the connecting elements, perpendicular to the length of the connecting elements, in each case in a rotationally unsymmetrical manner.

53. The electronic component as claimed in claim 52, wherein the attaching elements have an inner core of the first material, which is surrounded by the second material, at least the second material being electrically conductive.

54. The electronic component as claimed in claim 52, wherein the second material is gold.

55. A method of attaching two electronic components, the method comprising:

providing two electronic components, each of which have electrical contact terminals with exposed contact surfaces;

joining the components together by a means of attachment, the means of attachment comprising a plurality of conductive particles that are arranged on the contact terminals of at least one of the electronic components; and when the two components are joined together, establishing an electrically conducting connection between each contact terminal of one electronic component and each respective contact terminal of the other electronic component.

56. The method as claimed in claim 55, further comprising, before joining the components together, applying an adhesive to at least one of the components, the adhesive fixing the two components relative to one another after the joining together.

57. The method as claimed in claim 56, wherein the adhesive is applied to regions of the two components that lie outside the contact terminals.

58. The method as claimed in claim 56, wherein the adhesive contains a material that shrinks on curing.

59. The method as claimed in claim 56, wherein at least one of the two electronic components is an electronic printed circuit board.

60. The method as claimed in claim 56, wherein at least one of the two electronic components is an unpackaged semiconductor chip, the contact terminals of the unpackaged semiconductor chip being connected to an interconnect arranged over a semiconductor substrate.

\* \* \* \* \*

UNITED STATES PATENT AND TRADEMARK OFFICE
CERTIFICATE OF CORRECTION

PATENT NO. : 7,427,202 B2  Page 1 of 2
APPLICATION NO. : 11/317638
DATED : September 23, 2008
INVENTOR(S) : Schamberger et al.

It is certified that error appears in the above-identified patent and that said Letters Patent is hereby corrected as shown below:

In the drawings, Sheet 8, Fig. 17, in the 2$^{nd}$ box from top, 2$^{nd}$ line, delete "CANTACT" and insert --CONTACT--.
In Col. 2, lines 11 and 12, delete "elongate" and insert --elongated--.
In Col. 2, line 27, after elements insert --are--.
In Col. 3, line 35, after elements insert --,--.
In Col. 4, line 41, delete "book-shaped" and insert --hook-shaped--.
In Col. 5, line 44, delete "Velcro® like" and insert --Velcro®-like--.
In Col. 5, line 51, delete "Velcro® like" and insert --Velcro®-like--.
In Col. 6, line 51, after together insert --.--.
In Col. 6, line 53, after component insert --.--.
In Col. 6, line 64, after connection insert --.--.
In Col. 7, lines 10 and 11, delete "to be placed in each case on each contact terminal, the connecting elements".
In Col. 11, line 65, after element insert --.--.
In Col. 12, line 13, delete "tabular" and insert --tubular--.
In Col. 13, line 39, delete "cad" and insert --end--.
In Col. 13, line 41, delete "I" and insert --1--.
In Col. 13, line 49, delete "6rst" and insert --first--.
In Col. 13, line 54, delete "ranged" and insert --arranged--.
In Col. 14, line 29, delete "arc" and insert --are--.
In Col. 14, line 44, delete "form" and insert --from--.
In Col. 14, line 58, delete "n" and insert --in--.
In Col. 15, line 21, delete "1." and insert --1,--.
In Col. 15, line 22, delete "book" and insert --hook--.
In Col. 15, line 22, delete "Velcro®" and insert --Velcro®- --.
In Col. 15, line 24, delete "I" and insert --1--.
In Col. 17, line 8, delete "aid" and insert --end--.
In Col. 17, line 18, after 31$a$ insert --,--.
In Col. 17, line 27, delete "patties" and insert --particles--.
In Col. 17, line 38, delete "31-" and insert --31.--.
In Col. 17, line 39, delete "22" and insert --20--.
In Col. 17, line 43, delete "2" and insert --,--.
In Col. 17, line 46, after 21$a$ insert --;--.
In Col. 17, line 67, delete "21a" and insert --21$a$--.
In Col. 17, line 67, delete "31a" and insert --31$a$--.

UNITED STATES PATENT AND TRADEMARK OFFICE
CERTIFICATE OF CORRECTION

PATENT NO. : 7,427,202 B2
APPLICATION NO. : 11/317638
DATED : September 23, 2008
INVENTOR(S) : Schamberger et al.

It is certified that error appears in the above-identified patent and that said Letters Patent is hereby corrected as shown below:

In Col. 18, line 4, delete "flintier" and insert --further--.
In Col. 18, line 10, delete "3" and insert --13--.
In Col. 18, line 27, delete "4" and insert --.--.
In Col. 18, line 36, delete "10." and insert --10,--.
In Col. 18, line 53, delete "arc" and insert --are--.
In Col. 18, line 60, delete "net".
In Col. 21, line 33, delete "components".
In Col. 21, line 36, delete "components".

Signed and Sealed this

Twenty-fifth Day of November, 2008

JON W. DUDAS
*Director of the United States Patent and Trademark Office*